(12) United States Patent
Wang et al.

(10) Patent No.: US 7,670,933 B1
(45) Date of Patent: Mar. 2, 2010

(54) NANOWIRE-TEMPLATED LATERAL EPITAXIAL GROWTH OF NON-POLAR GROUP III NITRIDES

(75) Inventors: George T. Wang, Albuquerque, NM (US); Qiming Li, Albuquerque, NM (US); J. Randall Creighton, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 201 days.

(21) Appl. No.: 11/866,748

(22) Filed: Oct. 3, 2007

(51) Int. Cl.
*H01L 21/205* (2006.01)
*C30B 25/00* (2006.01)
*C30B 29/38* (2006.01)
*C30B 29/60* (2006.01)

(52) U.S. Cl. ............... 438/481; 117/87; 117/95; 117/104; 117/902; 117/921; 117/952; 977/762; 977/816; 977/817; 977/821; 977/891; 438/503

(58) Field of Classification Search ........... 117/87, 117/95, 101, 104, 106, 902, 921, 923, 952; 438/481, 503; 977/731, 816, 817, 821, 891, 977/762
See application file for complete search history.

(56) References Cited

U.S. PATENT DOCUMENTS

| | | | |
|---|---|---|---|
| 5,176,557 A * | 1/1993 | Okunuki et al. ............. 445/24 |
| 6,051,849 A | 4/2000 | Davis et al. |
| 6,380,108 B1 | 4/2002 | Linthicum et al. |
| 6,599,362 B2 | 7/2003 | Ashby et al. |
| 6,692,568 B2 | 2/2004 | Cuomo et al. |
| 7,052,979 B2 | 5/2006 | Nagai et al. |
| 7,358,160 B2 * | 4/2008 | Li et al. .................... 438/478 |
| 7,364,929 B2 * | 4/2008 | Terano et al. ............... 438/46 |
| 7,390,360 B2 * | 6/2008 | Shenai-Khatkhate et al. .. 117/84 |
| 7,407,872 B2 * | 8/2008 | Han et al. .................. 438/483 |
| 7,528,002 B2 * | 5/2009 | Samuelson et al. ........... 438/94 |
| 2002/0004254 A1 * | 1/2002 | Miki et al. ................... 438/46 |
| 2003/0198837 A1 | 10/2003 | Craven et al. |
| 2006/0073680 A1 * | 4/2006 | Han et al. .................. 438/479 |
| 2007/0224715 A1 * | 9/2007 | Terano et al. ................ 438/29 |
| 2009/0098343 A1 * | 4/2009 | Arena et al. ................ 428/172 |

FOREIGN PATENT DOCUMENTS

JP    2002-026389    *    1/2002

OTHER PUBLICATIONS

D. Iida et al, "One-step lateral growth for reduction in defect density of *a*-plane GaN on *r*-sapphire substrate and its application in emitters" Physica Status Solidi (PSS), (a) 204, No. 6 (2007) pp. 2005-2009.

(Continued)

*Primary Examiner*—M. Wilczewski
(74) *Attorney, Agent, or Firm*—Carol I Ashby

(57) ABSTRACT

A method for growing high quality, nonpolar Group III nitrides using lateral growth from Group III nitride nanowires. The method of nanowire-templated lateral epitaxial growth (NTLEG) employs crystallographically aligned, substantially vertical Group III nitride nanowire arrays grown by metal-catalyzed metal-organic chemical vapor deposition (MOCVD) as templates for the lateral growth and coalescence of virtually crack-free Group III nitride films. This method requires no patterning or separate nitride growth step.

11 Claims, 2 Drawing Sheets

OTHER PUBLICATIONS

Te-Chung Wang et al, "Trenched epitaxial lateral overgrowth of fast coalesced *a*-plane GaN with low dislocation density", Applied Physics Letters (2006) vol. 89, pp. 251109-1 through 251109-3.

George T. Wang et al, "Highly aligned, template-free growth and characterization of vertical GaN nanowires on sapphire by metal-organic chemical vapour deposition" Institute of Physics Publishing, Nanotechnology, vol. 17, (2006) pp. 5773-5780.

M.D. Craven et al, "Nonpolar (1120) *a*-Plane Gallium Nitride Thin Films Grown on (1102) *r*-plane Sapphire: Heteroepitaxy and Lateral Overgrowth", Phys. Stat. Sol (a) 194, No. 2, (2002) pp. 541-544.

U.S. Appl. No. 11/866,684, filed Oct. 3, 2007.

* cited by examiner

US 7,670,933 B1

NANOWIRE-TEMPLATED LATERAL EPITAXIAL GROWTH OF NON-POLAR GROUP III NITRIDES

The United States Government has rights in this invention pursuant to Department of Energy Contract No. DE-AC04-94AL85000 with Sandia Corporation.

CROSS-REFERENCE TO RELATED APPLICATIONS

This application is related to a copending application, Highly Aligned Vertical GaN Nanowires Using Submonolayer Metal Catalysts," application Ser. No. 11/866,684 filed Oct. 3, 2007, which has the same inventors.

BACKGROUND OF THE INVENTION

This invention relates to a method of growing high quality, nonpolar Group III nitrides. Group III nitrides that are conventionally grown on c-plane sapphire substrates have a c-plane surface, which is inherently polar due to the crystallographic location of the Group III atoms and nitrogen atoms in the (0001) plane (c-plane). The resulting internal electric fields are advantageous for applications where the formation of a two-dimensional electron gas is desired, as in transistors. However, the fields cause spatial separation of electrons and holes within quantum wells, which produces both a red-shift of optical transitions and a reduction of the oscillator strength. Elimination of such polarization-induced field effects could be achieve by the use of nonpolar nitride surfaces, such as the a-plane surface. In the absence of polarization along the growth direction, undesirable shifting and reduction of emission intensity can be achieved; flat-band conditions can also be achieved without the application of an external electric field.

Nonpolar ($11\bar{2}0$) a-plane GaN has been grown on ($1\bar{1}02$) r-plane sapphire substrates, with $[0001]_{GaN} \| [\bar{1}101]_{sapphire}$ and $[\bar{1}100]_{GaN} \| [11\bar{2}0]_{sapphire}$ (M. D. Craven, S. H. Lim, F. Wu, J. S. Speck, and S. P. DenBaars, "Nonpolar ($11\bar{2}0$) a-plane Gallium nitride Thin films Grown on ($1\bar{1}02$) r-plane Sapphire: Heteroepitaxy and Lateral Overgrowth," Phys. Stat. Sol. (a), vol. 194 (2002). pp. 541-544). Threading dislocation (TD) densities of approximately $2.6 \times 10^{10}/cm^{-2}$ were reported for heteroepitaxial continuous a-plane GaN. Reduction of threading dislocations was obtained by lateral epitaxial overgrowth over a $SiO_2$ mask with mask stripe openings aligned along $[\bar{1}100]_{GaN}$.

Cuomo and coworkers report a method utilizing sputter transport techniques to produce arrays or layers of self-forming, self-oriented columnar structures characterized as discrete, single-crystal Group III nitride posts or columns on various substrates. The columnar structure is formed in a single growth step. A group III metal source vapor is produced by sputtering a target, for combination with nitrogen supplied from a nitrogen-containing source gas. The III/V ratio is adjusted or controlled to create a Group III metal-ric environment within the reactionchamber conducive to preferential column growth. The reactant vapor species are deposited on the growth surface to produce single-crystal $M^{III}N$ columns thereon. The columns can be employed as a strain-relieving platform for the growth of continuous, low defect-density, bulk materials. Additionally, the growth conditions can be readjusted to effect columnar epitaxial overgrowth, wherein coalescence of the Group III nitride material occurs at the tops of the columns, thereby forming a substantially continuous layer upon which additional layers can be deposited (J. J. Cuomo, N. M. Williams, A. D. Hanser, E. P. Carlson, and D. T. Thomas, "Method and Apparatus for Producing $M^{III}N$ columns and $M^{III}N$ materials Grown Thereon," U.S. Pat. No. 6,692,568).

BRIEF DESCRIPTION OF THE DRAWINGS

The accompanying drawings, which are incorporated in and form part of the specification, illustrate some embodiments of the present invention and, together with the description, serve to explain the principles of the invention.

DETAILED DESCRIPTION OF THE INVENTION

Figure 1:
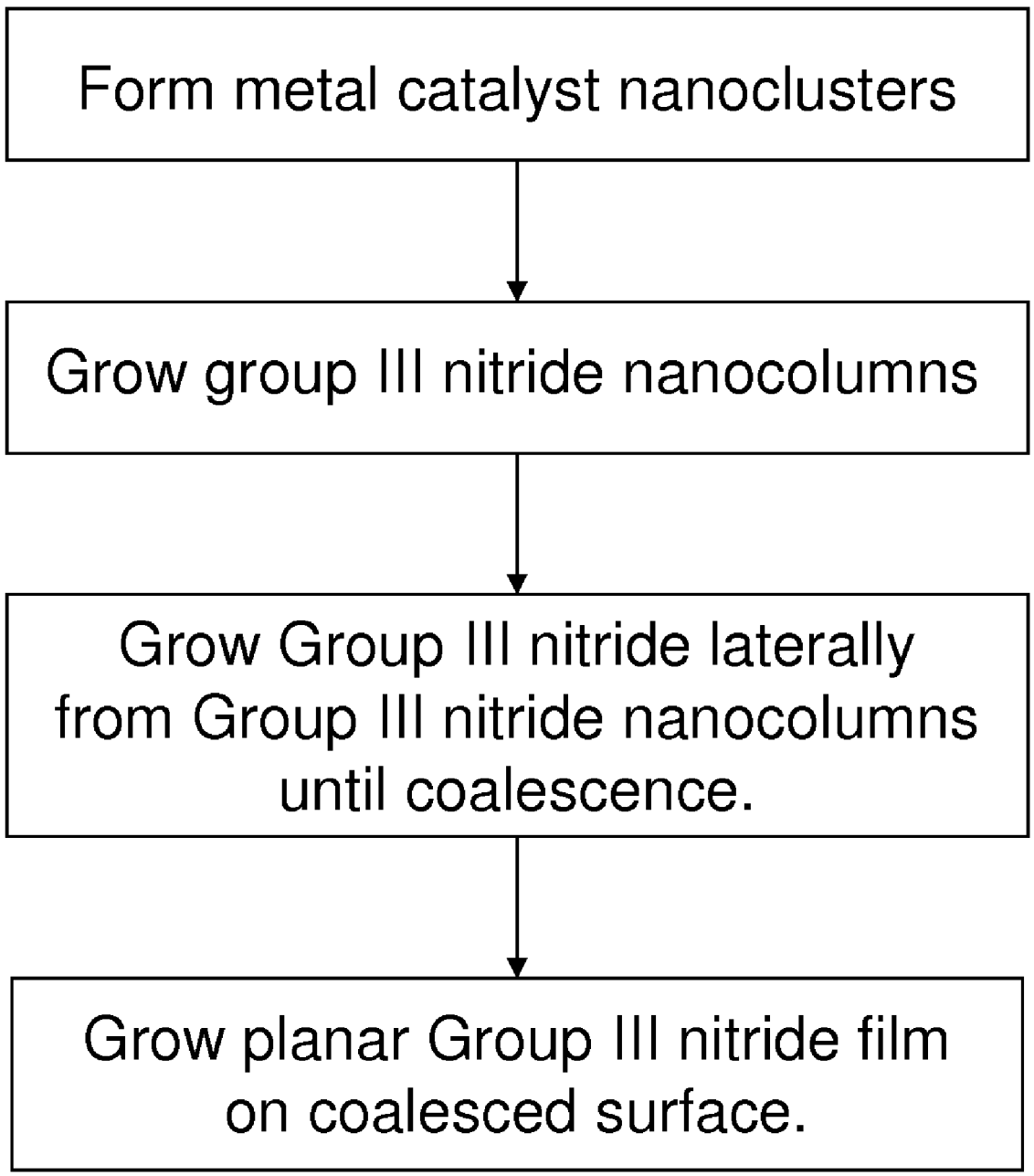
FIG. 1 illustrates a flowchart of steps of an embodiment of the present invention.

This invention comprises a method for growing high quality, nonpolar Group III nitrides using lateral growth from Group III nitride nanowires. The method of nanowire-templated lateral epitaxial growth (NTLEG) employs crystallographically aligned, substantially vertical Group III nitride nanowire arrays grown by metal-catalyzed metal-organic chemical vapor deposition (MOCVD) as templates for the lateral growth and coalescence of virtually crack-free Group III nitride films. This method requires no patterning or separate nitride growth step.

This invention comprises a method for growing virtually crack-free a-plane GaN on r-plane sapphire by using a mode of metal-organic chemical vapor deposition (MOCVD) that produces epitaxial lateral growth of Group III nitride material from the sidewalls of crystallographically oriented and substantially single-crystal Group III nitride nanowires or nanocolumns. A reduction in defects is made possible by minimizing the strain energy in the epilayer by growth on 3D-compliant nanowires that connect the epilayer and underlying substrate. Beneath the coalesced film region, the nanowires serve as a stress-relief layer to avoid the formation of cracks that extend up through the surface of the Group III nitride layer. The presence of the stress-relieving nanowires can yield a substrate that may be especially good for growing nitride ternaries and quaternaries that have lattice constants sufficiently different from the substrate as to make crack formation a significant problem.

While it is generally desirable for the Group III nitride nanowires to be substantially vertical, deviation from vertical (tilted or bent nanowires) is also acceptable as long as the crystallographic orientation of the bent nanowire regions with respect to the substrate of the bent nanowire regions is the same as that of the vertical nanowires. In various embodiments, a dense, highly aligned array of single-crystal, dislocation-free GaN nanowires are grown on unpatterned ($1\bar{1}02$) r-plane sapphire. The vertical nanowires are oriented in the $[11\bar{2}0]$ direction and have triangular cross sections. The high degree of vertical alignment can be explained by the lattice match between the $[11\bar{2}0]$ oriented nanowires and the r-plane sapphire surface. The nanowires have aligned facets, which allow the nanowires to serve as a template for lateral film growth and coalescence into a single crystalline film. An alteration of the growth conditions shifts the growth mode from nanowire growth to lateral film growth. Lateral growth leads to coalescence of the growth fronts from adjacent nanowires and a laterally continuous film is formed. Vertical film growth may simultaneously occur to help achieve a smooth, flat coalesced film. The quality of the coalesced film depends in part on the characteristics of the nanowire template, including the degree of alignment, the structural quality, the areal density, and the uniformity of the nanowires. When the nanowires are oriented in a [11$\bar{2}$0] direction, the resulting nitride film also has a (11$\bar{2}$0) orientation, the nonpolar orientation termed a-plane Group III nitride.

Figure 2:
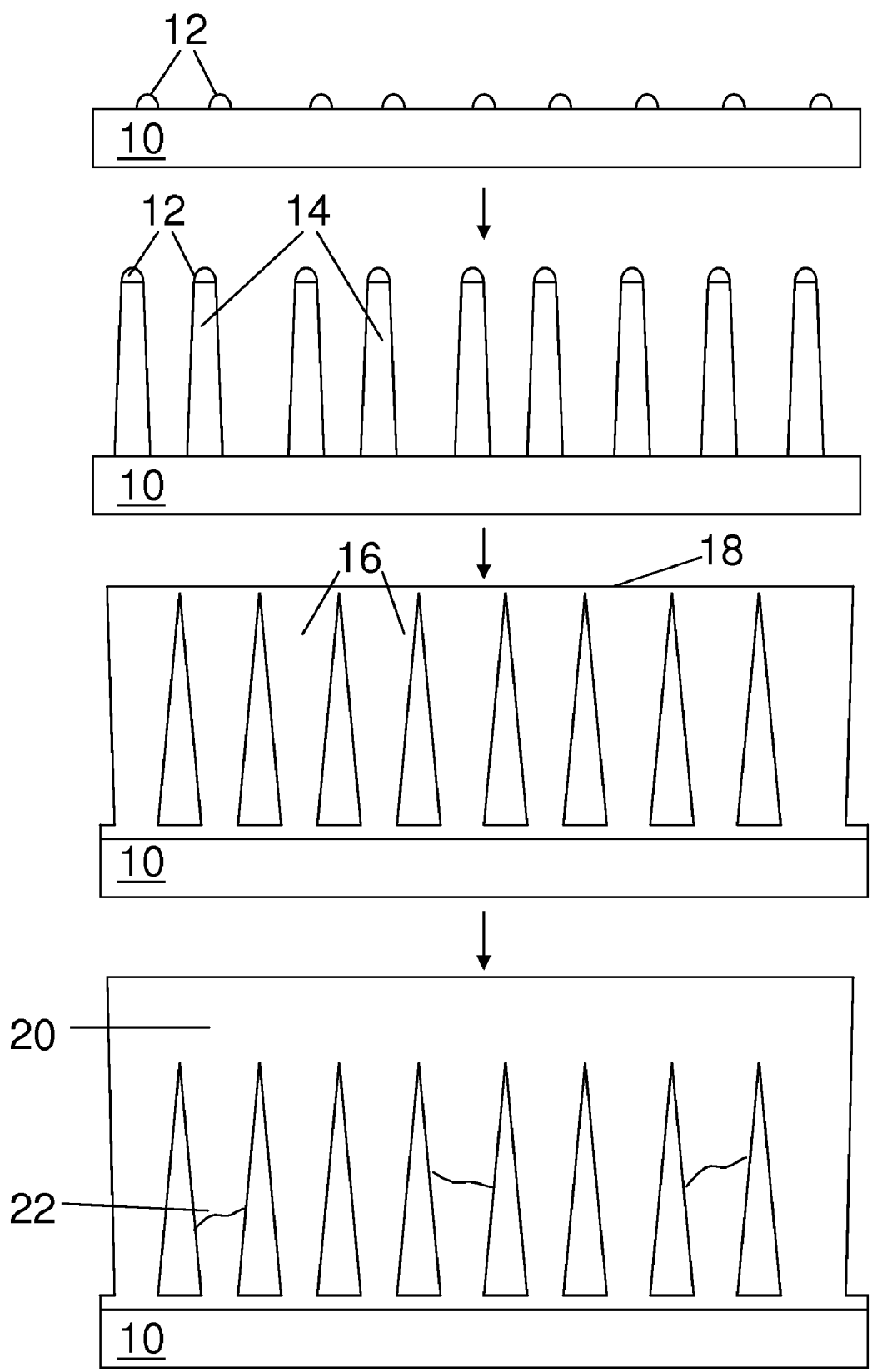
FIG. 2 illustrates the structural evolution of a film grown by an embodiment of this invention.

FIG. 1 presents a flowchart of an embodiment of this invention. An embodiment of this invention is also illustrated in FIG. 2. A plurality of metal catalyst nanoclusters 12 are formed on a surface of a crystalline substrate 10, which serves as the crystallographic template. Group III nitride nanowires 14 that are single crystal and crystallographically oriented with respect to the crystallographic template substrate 10 are grown by metal-catalyzed MOCVD. Upon growing the nanowires to a suitable length, the MOCVD growth conditions are changed to lateral growth conditions. These conditions produce enhanced lateral growth from the sidewalls of the nanowires to until coalescence of adjacent laterally growing wires 16 forms a continuous surface 18. Continued growth following coalescence forms a crack-free region 20 above the region of coalesced nanowires. The strain energy in the epilayer is minimized by growth on 3D-compliant nanowires that connect the epilayer and underlying substrate, leading to reduced defects and cracking in the epilayer. The formation of cracks 22 in the nanowire region of the structure is visible indication of stress relief from the nanowire template. Continued growth of material of the same composition as the nanowires or of a Group III nitride of a different composition, such as AlGaN, InGaN, or AlGaInN, may be grown.

The length of nanowires that is suitable for a set of reaction conditions depends on the relative rates of lateral and vertical growth under the MOCVD conditions termed lateral growth conditions. A suitable length for the nanowires is a length that is long enough to permit coalescence of the laterally growing nitride material before coalescing with any underlying film growing up from the substrate. This results in a partially suspended epilayer and enables the buried nanowires to act as compliant bridges between the coalesced epilayer and substrate and provide the stress relief to reduce defect formation and cracks that extend to the surface of the film.

For the growth of a-plane GaN, two suitable substrate surfaces are r-plane sapphire and a-plane GaN. The relatively small lattice constant mismatch between r-plane sapphire and a-plane GaN (~1.3% in the [0001] GaN and [−1 1 0 1] Al2O3 direction) makes r-plane sapphire a good choice as a crystallographic template substrate for the growth of a-plane GaN nanowires. The size and areal density and distribution of the metal nanocluster catalysts may be adjusted by changing the amount of catalyst metal applied to the surface. Nanoclusters that are more uniform both in size and in their distribution on the substrate surface are formed using an amount of catalyst metal equivalent to a monolayer or less. This enables the diffusion of metal atoms to be primarily the diffusion of the metal on the substrate surface rather than diffusion of the metal on a layer of the metal itself. Conditions for formation of highly uniform catalytic nanoclusters by deposition of evaporated metal atoms is described in detail in the inventors' patent application, "Highly Aligned Vertical GaN Nanowires Using Submonolayer Metal Catalysts," application Ser. No. 11/866,684 which is incorporated herein by reference.

In one embodiment, an amount of Ni equivalent in mass to 0.8 Å Ni was deposited on the surface of an r-plane sapphire substrate. The metallized substrate was heated under $H_2$ to enable surface diffusion of the metal atoms to form metal catalyst nanoclusters. For the growth of the GaN nanowires, when the substrate is at a temperature of approximately 780° C., reactants are introduced into the MOCVD reaction chamber to produce a high V/III precursor ratio (a nitrogen-precursor-rich environment): 50 sccm $H_2$ through a 20° C. trimethyl gallium bubbler, 2000 sccm ammonia, 10,200 sccm $H_2$ at a total pressure of 140 Torr. Reaction to form the vertical nanowires is carried out at 780° C. for 300 seconds. For the lateral growth from the nanowire sidewalls to achieve coalescence, the following conditions are used: 3.6 sccm of $H_2$ through a −10° C. bubbler at 500 Torr, 5800 sccm ammonia, 7500 sccm $H_2$ at a total pressure of 140 Torr. The coalescence reaction is performed at 1100° C. for approximately 9000 seconds. Following coalescence, film growth can be continued under growth conditions suited for forming high-quality a-plane GaN.

The preceding embodiment employed a submonolayer quantity of metal to form the metal catalysts. Catalyst metal nanoclusters may also be formed by depositing multilayer quantities of metal atoms on the substrate surface and heating to produce surface diffusion to form nanoclusters.

In some embodiments, the metal nanocluster catalyst can be generated on the substrate surface using a solution of a suitable metal salt. An example of this approach to forming nanoclusters is provided in G. T. Wang, A. A. Talin, D. J. Werder, J. R. Creighton, E. Lai, R. J. Anderson, and I. Arslan, "Highly aligned, template-free growth and characterization of vertical GaN nanowires on sapphire by metal-organic chemical vapour deposition," Nanotechnology Vol. 12 (2006) pp. 5773-5780, which is incorporated herein by reference. A highly dilute solution of a Ni salt is applied to the surface of the substrate and the solvent is removed. In one embodiment, $Ni(NO_3)_2 \cdot 6H_2O$ was dissolved in absolute ethanol to a desired concentration and applied to the sapphire wafer surface. Some methods of applying the catalyst solution include but are not restricted to applying drip-wise via a dispensing pipette; spin-coating may be employed in some embodiments to provide a uniform distribution of catalyst solution across a wafer surface. Following application of the catalyst solution, the wafer is placed into the MOCVD rotating-disc reactor for growth. After heating to the desired growth temperature in 7500 sccm of $H_2$, 5800 sccm of ammonia and 50 sccm of $H_2$ passed through a trimethylgallium bubbler at 18° C. is introduced into the reactor. The reactor pressure is held constant at 140 Torr and the wafer rotating rate is 1200 rpm. In one embodiment, a growth time of 180 seconds was used. Other growth times may also be employed.

Nanowires have be grown using catalyst solution concentrations between 0.015 and 0.0005 M. Lower concentrations produce arrays of nanowires that are more vertical and more highly aligned. The proper concentration for use in a particular embodiment will depend on the method employed for distributing the catalyst solution upon the wafer surface. Thinner solution layers, such as would form after high-velocity spin-coating, allow the use of higher concentrations while drop-coating requires lower concentration. The concentration should be selected so as to enable formation of uniformly dispersed small metal nanoclusters after reduction using a reducing gas such as $H_2$ and after metal diffusion at elevated temperatures.

Suitable metals for use as the metal catalyst nanoclusters include Ni, Au, Pt, Ga, In, Co, and Fe.

After the growth of the nanowire templates, MOCVD growth conditions are altered to shift the growth mode from nanowire growth conditions to lateral growth conditions. Lateral growth of Group III nitride from the nanowires results in coalescence of the laterally growing structures to form a continuous film. Under lateral growth conditions, both lateral and vertical growth are occurring. Further growth after coalescence leads to the formation of progressively thicker films.

In one embodiment, the following conditions are used as lateral growth conditions: 3.6 sccm of $H_2$ through a $-10°$ C. bubbler at 500 Torr, 5800 sccm ammonia, 7500 sccm $H_2$ at a total pressure of 140 Torr. The coalescence reaction is performed at 1100° C.

In general, growth at lower temperatures (between 650° C. and 950° C.) favors metal-catalyzed nanowire growth. Growth at higher temperatures (between 900° C. and 1150° C.) favors lateral growth. The III/V precursor ratio for both the nanowire growth and the lateral growth is greater than 1, making the reaction gas mixture nitrogen-rich. Changing the growth conditions, including V/III precursor ratio, temperature, and pressure, will affect the lateral coalescence and quality of the coalesced film.

In various embodiments, suitable Group III metal precursors include but are not restricted to trimethyl gallium, triethyl gallium, gallium-containing hydrocarbon compounds, gallium oxide, and gallium nitride. Suitable nitrogen precursors include but are not restricted to ammonia and nitrogen.

After the growth of the nanowire template, the growth precursors and conditions can be altered to laterally grow and coalesce III-nitride films besides GaN, including AlN, AlGaN alloys, InN, and InGaN alloys. Thus, the nanowire templates are a route to high quality, a-plane films in the III-nitride material system, and not limited to GaN.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for nanowire-templated lateral epitaxial growth of nonpolar Group III nitrides, comprising:
    forming a plurality of metal catalyst nanoclusters on a surface of a crystallographic template substrate;
    growing by a metal-organic chemical vapor growth technique a plurality of single-crystal Group III nitride nanowires that are substantially vertically oriented relative to the surface using the plurality of metal catalyst nanoclusters to catalyze nanowire growth under nanowire growth conditions, wherein the single-crystal Group III nitride nanowires are crystallographically aligned with the crystallographic template substrate; and
    growing by a metal-organic chemical vapor growth technique a Group III nitride material laterally from the single-crystal Group III nitride nanowires under lateral growth conditions to form a coalesced Group III nitride layer.

2. The method of claim 1, wherein the crystallographic template substrate is r-plane sapphire or a-plane GaN.

3. The method of claim 1, wherein the nanowire growth conditions and the lateral growth conditions comprise a Group III metal precursor and a nitrogen precursor, and wherein a ratio of nitrogen precursor to Group III metal precursor is greater than 1.

4. The method of claim 3, wherein the Group III metal precursor is selected from the group consisting of trimethyl gallium, triethyl gallium, gallium-containing hydrocarbon compounds, gallium oxide, and gallium nitride.

5. The method of claim 3, wherein the nitrogen precursor is selected from the group consisting of ammonia and nitrogen.

6. The method of claim 1, wherein the plurality of metal catalyst nanoclusters are made of a metal selected from the group consisting of Ni, Au, Pt, Ga, In, Co, and Fe.

7. The method of claim 1, wherein the step of forming the plurality of metal catalyst nanoclusters comprises:
    depositing up to approximately a monolayer of catalyst metal atoms on the surface of the crystallographic template substrate; and
    heating the crystallographic template substrate in a reducing atmosphere to induce surface diffusion of the catalyst metal atoms to form the plurality of metal nanoclusters.

8. The method of claim 1, wherein the step of forming the plurality of metal catalyst nanoclusters comprises:
    depositing catalyst metal atoms on the surface of the crystallographic template substrate; and
    heating the crystallographic template substrate in a reducing atmosphere to induce surface diffusion of the catalyst metal atoms to form the plurality of metal nanoclusters.

9. The method of claim 1, wherein the step of forming the plurality of metal catalyst nanoclusters comprises:
    depositing a solution comprising a solvent and a salt of metal catalyst ions onto the surface of the crystallographic template substrate;
    removing the solvent; and
    heating the crystallographic template substrate in a reducing atmosphere to reduce the metal catalyst ions to catalyst metal atoms and to induce surface diffusion of the catalyst metal atoms to form the plurality of metal nanoclusters.

10. The method of claim 1, wherein the nanowire growth conditions comprise a substrate temperature between approximately 650° C. and approximately 950° C. and wherein the lateral growth conditions comprise a substrate temperature between approximately 900° C. and approximately 1150° C.

11. The method of claim 1, wherein the coalesced Group III nitride layer comprises at least one Group III species selected from the group consisting of Al, Ga, and In.

* * * * *